US009575316B2

(12) United States Patent
Bahmandar et al.

(10) Patent No.: US 9,575,316 B2
(45) Date of Patent: Feb. 21, 2017

(54) SIMPLIFIED MIRROR

(71) Applicant: Google Inc., Mountain View, CA (US)

(72) Inventors: Ali-Reza Bahmandar, Issaquah, WA (US); Oscar Luis Martinez, Redwood City, CA (US); Michael Baldwinson, San Jose, CA (US); Ajay Kamath, San Jose, CA (US)

(73) Assignee: Google Inc., Mountain View, CA (US)

( * ) Notice: Subject to any disclaimer, the term of this patent is extended or adjusted under 35 U.S.C. 154(b) by 111 days.

(21) Appl. No.: 14/526,531

(22) Filed: Oct. 29, 2014

(65) Prior Publication Data

US 2016/0124228 A1    May 5, 2016

(51) Int. Cl.
| | |
|---|---|
| *G02B 27/01* | (2006.01) |
| *G02B 27/10* | (2006.01) |
| *G02B 5/10* | (2006.01) |
| *G02B 5/08* | (2006.01) |
| *B32B 17/06* | (2006.01) |
| *G02B 1/12* | (2006.01) |
| *C23C 16/40* | (2006.01) |
| *C23C 14/08* | (2006.01) |
| *C23C 14/10* | (2006.01) |

(52) U.S. Cl.
CPC ......... *G02B 27/0172* (2013.01); *B32B 17/061* (2013.01); *C23C 14/081* (2013.01); *C23C 14/10* (2013.01); *C23C 16/402* (2013.01); *C23C 16/403* (2013.01); *G02B 1/12* (2013.01); *G02B 5/0858* (2013.01); *G02B 5/10* (2013.01); *G02B 27/1066* (2013.01); *G02B 2027/0178* (2013.01)

(58) Field of Classification Search
CPC .................................................. G02B 27/0172

USPC ................................................... 359/630, 631
See application file for complete search history.

(56) References Cited

U.S. PATENT DOCUMENTS

| 8,556,414 B2 | 10/2013 | Yoshida |
| 8,570,242 B2 | 10/2013 | Chosokabe et al. |

(Continued)

FOREIGN PATENT DOCUMENTS

| CN | 201654263 | 11/2010 |
| KR | 10-2009-0053316 | 5/2009 |

OTHER PUBLICATIONS

Machine translation of Chinese Patent Application No. CN201654263.

(Continued)

*Primary Examiner* — James Jones
(74) *Attorney, Agent, or Firm* — McDonnell Boehnen Hulbert & Berghoff LLP

(57) ABSTRACT

This disclosure relates to an optical system and a method for its manufacture. One embodiment of the optical system may include an optical material upon which a multilayer stack may be deposited. The multilayer stack may include a first layer composed on a first surface of the optical material, a second layer composed on the first layer, and a third layer composed on the second layer. Among other possibilities, the first layer may include $Al_2O_3$, the second layer may include Al, and the third layer may include $SiO_2$. The multilayer stack may be a reflective coating on a surface of the optical material with optical power. Thus, the reflective coating may serve as a reflective image former within the optical system. The optical system may be configured as a head-mountable device.

20 Claims, 7 Drawing Sheets

(56) References Cited

U.S. PATENT DOCUMENTS

| | | |
|---|---|---|
| 8,808,972 B2 | 8/2014 | Wang et al. |
| 8,867,131 B1 | 10/2014 | Amirparviz |
| 2012/0241198 A1* | 9/2012 | Kajiya ................ G06F 3/0412 |
| | | 174/250 |
| 2013/0070338 A1 | 3/2013 | Gupta |
| 2013/0135747 A1 | 5/2013 | Yano |
| 2014/0092461 A1 | 4/2014 | Spitzer et al. |
| 2014/0340759 A1* | 11/2014 | Yano ................ G02B 27/142 |
| | | 359/630 |

OTHER PUBLICATIONS

Machine translation of Korean Patent Application No. KR10-2009-0053316.
International Search Report, Application No. PCT/US2015/048263, mailed Dec. 21, 2015.

\* cited by examiner

SIMPLIFIED MIRROR

BACKGROUND

Computing devices such as personal computers, laptop computers, tablet computers, cellular phones, and countless types of Internet-capable devices are increasingly prevalent in numerous aspects of modern life. Over time, the manner in which these devices are providing information to users is becoming more intelligent, more efficient, more intuitive, and less obtrusive.

The trend toward miniaturization of computing hardware, peripherals, as well as of sensors, detectors, and image and audio processors, among other technologies, has helped open up a field sometimes referred to as "wearable computing." In the area of image and visual processing and production, in particular, it has become possible to consider wearable displays that place a very small image display element close enough to a wearer's eye (or eyes) such that the displayed image fills or nearly fills a field of view of the wearer, and appears as a normal-sized image, such as an image that might be displayed on a traditional image display device. The relevant technology may be referred to as "near-eye displays."

Near-eye displays are fundamental components of wearable displays, sometimes called "head-mounted displays" (HMDs). An HMD places a graphic display close to one or both eyes of a wearer. To generate the images on a display, a computer processing system can be used. Such displays can occupy a wearer's entire field of view, or only occupy part of wearer's field of view. Further, HMDs can be as small as a pair of glasses or as large as a helmet.

SUMMARY

An optical component may be manufactured by depositing a reflective coating on a curved portion of the optical component. The reflective coating may include multiple layers including a thin mirror stack and an $Al_2O_3$ adhesion layer. Increased reliability and decreased optical artifacts may be advantages when the optical component is utilized in the display of a head-mountable device (HMD) or another type of display and/or user interface.

In a first aspect, an optical system is provided. The optical system includes an image former configured to form a virtual image from a light pattern. The image former includes a first layer composed on a first end surface of an optical material. The image former also includes a second layer composed on the first layer and a third layer composed on the second layer. The first layer includes $Al_2O_3$, the second layer includes Al, and the third layer includes $SiO_2$.

In a second aspect, a method of manufacturing an optical system is provided. The method includes providing an optical system. The optical system includes an optical material having a first end surface. The optical system also includes a light source optically coupled to the optical material. The light source is configured to generate a light pattern. The method additionally includes forming a first layer on the first end surface of the optical material. The first layer includes $Al_2O_3$, the second layer includes Al, and the third layer includes $SiO_2$. The combination of the first, second, and third layers includes an overall thickness of between 250 nm and 300 nm.

Other aspects, embodiments, and implementations will become apparent to those of ordinary skill in the art by reading the following detailed description, with reference where appropriate to the accompanying drawings.

DETAILED DESCRIPTION

I. Overview

Figure 1A:
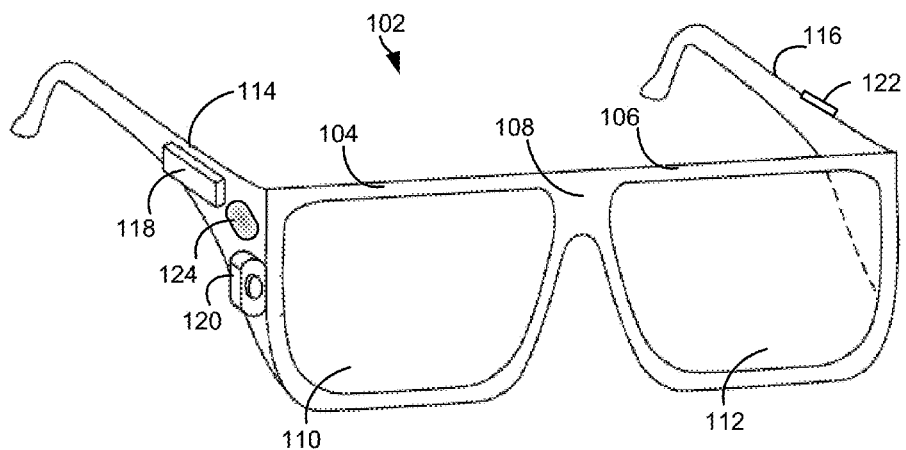
FIGS. 1A and 1B illustrate a wearable computing system, according to an embodiment.

An optical component and a method for its manufacture may include a deposited reflective coating on a curved portion of the optical component. Specifically, the optical component may include a thin mirror stack and an $Al_2O_3$ adhesion layer. These elements may help to improve reliability and/or reduce optical artifacts when the optical component is used in an optical system, such as in the display of a head-mountable device (HMD).

The optical component may be used as an image former in the HMD. For example, a display panel of an HMD may direct light towards the optical component, which then may focus or otherwise direct light towards a user's eye.

The body of the optical component may include an optically-transparent material, such as borosilicate glass (BK7, Pyrex, optical crown glass, etc.), fused silica, quartz, Zerodur, Zeonex, or other optical materials known in the art. In some embodiments, the body of the optical component may include a square or rectangular cross-section and may be configured to be positioned near one or both eyes of a user of the HMD.

While some embodiments described herein include HMDs, the optical component may be included in other types of displays. For instance, the optical component may alternatively be incorporated into another type of optical system, display, and/or user interface. In an example embodiment, the optical component may be used in association with a window, a car windshield, and/or a heads-up display. In such scenarios, the optical component may be used as an image-forming element to provide an image.

Additionally or alternatively, the optical component may be incorporated into a display system. For example, a television display may include one or more optical components. The one or more optical components may be operable to form an image in conjunction with the television screen. The optical component may be included in other display applications.

One face of the optical component may have a round or spherical extruded shape. That is, the optical component may have a curved face or surface. A reflective coating may be deposited on the curved face. The reflective coating may include multiple layers, which may include, for example, an $Al_2O_3$ layer, an aluminum layer, and a $SiO_2$ layer.

In one embodiment, the $Al_2O_3$ layer is deposited directly on the optical material, followed by the aluminum layer, and then the $SiO_2$ layer. Although not exclusive, the $Al_2O_3$ may act primarily as a surface adhesion layer, the aluminum may act primarily as a reflective layer, and the $SiO_2$ may act primarily as a protective coating. The deposited reflective coating on the curved surface may be configured to act as an image former and/or as a converging/concave mirror, at least with respect to the light patterns generated by a light source.

The deposited reflective coating may be deposited using physical vapor deposition (PVD), PECVD, ICPCVD, atomic layer deposition (ALD), or another deposition technique known in the art. Various deposition conditions may be controlled so as to minimize the amount of slope (e.g. material fall off) near the edges of the deposited layer on the curved surface (e.g. where the curved surface meets the other surfaces of the body of the optical component). Put another way, the thickness of the deposited reflective coating may be controlled to vary as little as possible across the entire area of the curved surface. The thickness of the deposited reflective coating may be around 250-300 nm in total. The thickness of the $Al_2O_3$ layer may be around 25 nm, the thickness of the Al layer may be around 100 nm, and the thickness of the $SiO_2$ layer may be around 150 nm. Other layer thicknesses are possible. In some embodiments, the reflectance of the deposited reflective coating may be around 88%.

II. Examples of Wearable Computing Devices

Figure 1B:
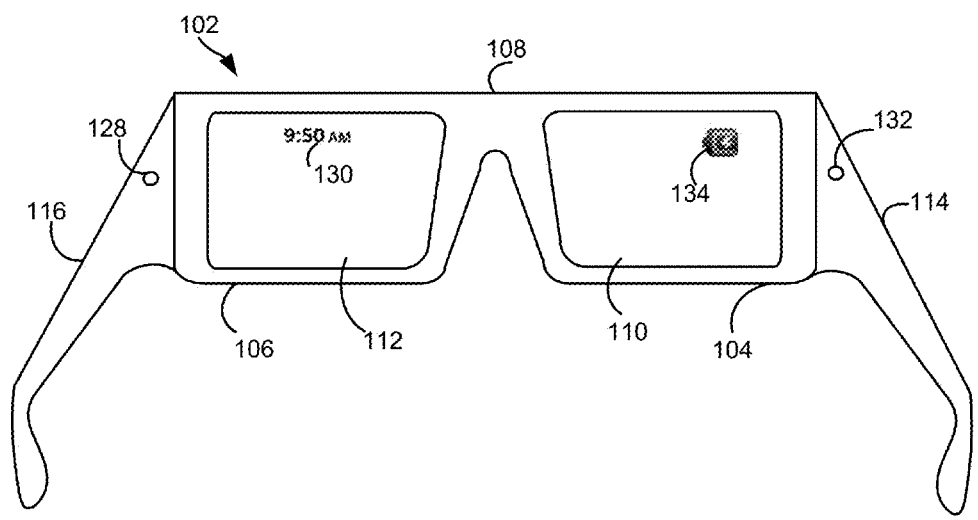

FIGS. 1A and 1B illustrate a wearable computing system, according to an embodiment. The wearable computing system is shown in the form of a head-mountable device (HMD) 102 (which may also be referred to in this disclosure as a head-mountable display). In general, the HMD 102 can include a front section and at least one side section. In FIG. 1A, the support structure has a front section that includes lens-frames 104, 106 and a center frame support 108. In addition, in FIG. 1A, the side-arms 114 and 116 can serve as the first and/or second side section of the support structure. It should be understood that the front section and the at least one side section may vary in form, depending upon the implementation.

The HMD 102 includes lens-frames 104, 106, a center frame support 108, lens elements 110, 112, and extending side-arms 114, 116. The center frame support 108 and the extending side-arms 114, 116 are configured to secure the HMD 102 to a wearer's face by way of the wearer's nose and ears, respectively.

Each of the frame elements 104, 106, 108 and the extending side-arms 114, 116 can be formed of a solid structure of plastic and/or metal, or can be formed of a hollow structure of similar material so as to allow wiring and component interconnects to be internally routed through the HMD 102. Other materials can be used as well.

One or more of each of the lens elements 110, 112 can be formed of any material that can suitably display a virtual image or graphic. Each of the lens elements 110, 112 can also be sufficiently transparent to allow a wearer to see through the lens element. Combining these two features of the lens elements can facilitate an augmented reality or heads-up display where the projected image or graphic is superimposed over a real-world view as perceived by the wearer through the lens elements.

The extending side-arms 114, 116 can each be projections that extend away from the lens-frames 104, 106, respectively, and can be positioned behind a wearer's ears to secure the HMD 102 to the wearer. The extending side-arms 114, 116 can further secure the HMD 102 to the wearer by extending around a rear portion of the wearer's head.

The HMD 102 can also include an on-board computing system 118, a video camera 120, a sensor 122, and a finger-operable touch pad 124. The on-board computing system 118 is shown to be positioned on the extending side-arm 114 of the HMD 102; however, the on-board computing system 118 can be provided on other parts of the HMD 102 or can be positioned remote from the HMD 102 (for example, the on-board computing system 118 could be wire- or wirelessly-connected to the HMD 102). The on-board computing system 118 can include a processor and memory, for example. The on-board computing system 118 can be configured to receive and analyze data from the video camera 120 and the finger-operable touch pad 124 (and possibly from other sensory devices, user interfaces, or both) and generate images for output by the lens elements 110 and 112.

The video camera 120 is shown positioned on the extending side-arm 114 of the HMD 102; however, the video camera 120 can be provided on other parts of the HMD 102. The video camera 120 can be configured to capture images at various resolutions or at different frame rates. Many video cameras with a small form-factor, such as those used in cell phones or webcams, for example, can be incorporated into an example of the HMD 102.

Further, although FIG. 1A illustrates one video camera 120, more video cameras can be used, and each can be configured to capture the same view, or to capture different views. For example, the video camera 120 can be forward facing to capture at least a portion of the real-world view perceived by the wearer. This forward facing image captured by the video camera 120 can then be used to generate an augmented reality where computer generated images appear to interact with the real-world view perceived by the wearer.

The sensor 122 is shown on the extending side-arm 116 of the HMD 102; however, the sensor 122 can be positioned on other parts of the HMD 102. The sensor 122 can include one or more of a gyroscope or an accelerometer, for example. Other sensing devices can be included within, or in addition to, the sensor 122 or other sensing functions can be performed by the sensor 122.

The finger-operable touch pad 124 is shown on the extending side-arm 114 of the HMD 102. However, the finger-operable touch pad 124 can be positioned on other parts of the HMD 102. Also, more than one finger-operable touch pad can be present on the HMD 102. The finger-operable touch pad 124 can be used by a wearer to input commands. The finger-operable touch pad 124 can sense at least one of a position and a movement of a finger by way of capacitive sensing, resistance sensing, or a surface acoustic wave process, among other possibilities. The finger-operable touch pad 124 can be capable of sensing finger movement in a direction parallel or planar to the pad surface, in a direction normal to the pad surface, or both, and can also be capable of sensing a level of pressure applied to the pad surface. The finger-operable touch pad 124 can be formed of one or more translucent or transparent insulating layers and one or more translucent or transparent conducting layers. Edges of the finger-operable touch pad 124 can be formed to have a raised, indented, or roughened surface, so as to provide tactile feedback to a wearer when the wearer's finger reaches the edge, or other area, of the finger-operable touch pad 124. If more than one finger-operable touch pad is present, each finger-operable touch pad can be operated independently, and can provide a different function.

FIG. 1B illustrates another view of the HMD 102 illustrated in FIG. 1A. As shown in FIG. 1B, the lens elements 110, 112 can act as display elements. The HMD 102 can include a first projector 128 coupled to an inside surface of the extending side-arm 116 and configured to project a display 130 onto an inside surface of the lens element 112. A second projector 132 can be coupled to an inside surface of the extending side-arm 114 and can be configured to project a display 134 onto an inside surface of the lens element 110.

The lens elements 110, 112 can act as a combiner in a light projection system and can include a coating that reflects the light projected onto them from the projectors 128, 132. In some embodiments, a reflective coating may not be used (for example, when the projectors 128, 132 are scanning laser devices).

In some implementations, other types of display elements can be used. For example, the lens elements 110, 112 can include a transparent or semi-transparent matrix display, such as an electroluminescent display or a liquid crystal display; one or more waveguides for delivering an image to the wearer's eyes; and other optical elements capable of delivering an in focus near-to-eye image to the wearer. A corresponding display driver can be disposed within the frame elements 104, 106 for driving such a matrix display. A laser or LED source and scanning system can be used to draw a raster display directly onto the retina of one or more of the wearer's eyes. These examples are merely illustrative; other possibilities exist as well.

Figure 1C:
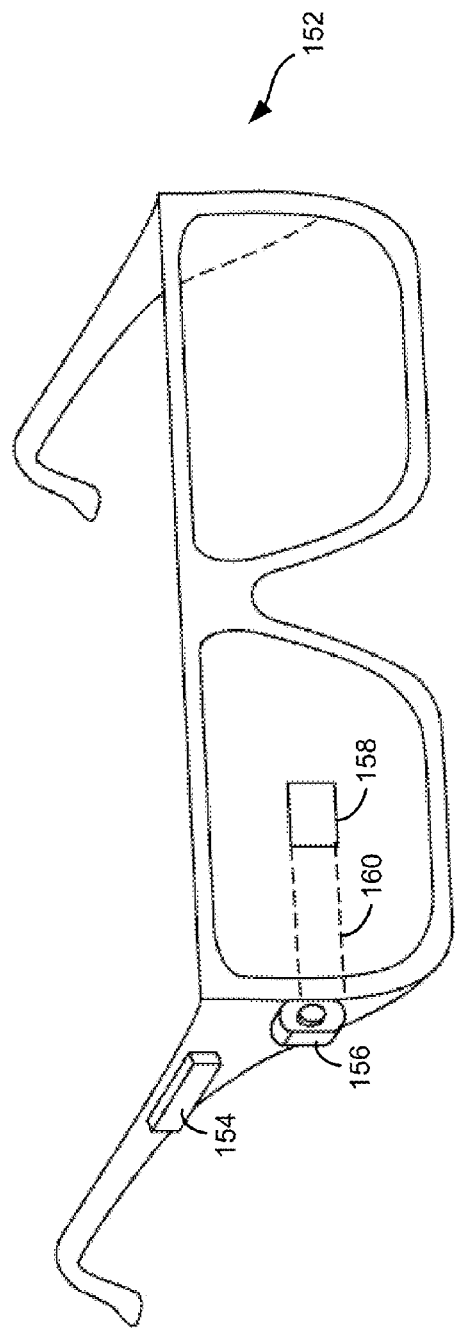
FIG. 1C illustrates another wearable computing system, according to an embodiment.

FIG. 1C illustrates another wearable computing system, according to an embodiment. The wearable computing system is in the form of an HMD 152. The HMD 152 can include frame elements and side-arms, such as those described above in connection with FIGS. 1A and 1B. In addition, the HMD 152 can include an on-board computing system 154 and a video camera 156, such as those described above in connection with FIGS. 1A and 1B. The video camera 156 is shown mounted on a frame of the HMD 152. However, the video camera 156 can be mounted at other positions as well.

As shown in FIG. 1C, the HMD 152 can include a single display 158, which can be coupled to the HMD 152. The display 158 can be formed on one of the lens elements of the HMD 152, such as, for example, a lens element described above in connection with FIGS. 1A and 1B, and can be configured to overlay computer-generated graphics in the wearer's view of the physical world. The display 158 is shown to be provided in a center of a lens of the HMD 152; however, the display 158 can be provided in other positions as well. The display 158 is controllable by way of the computing system 154, which is coupled to the display 158 by way of an optical waveguide 160.

Figure 1D:
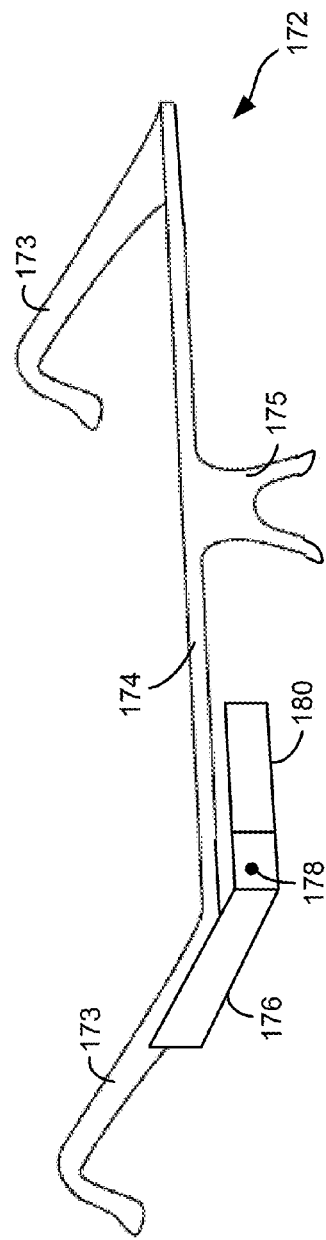
FIG. 1D illustrates another wearable computing system, according to an embodiment.

FIG. 1D illustrates another wearable computing system, according to an embodiment. The wearable computing system is in the form of an HMD 172. The HMD 172 can include side-arms 173, a center frame support 174, and a bridge portion with a nosepiece 175. The center frame support 174 connects the side-arms 173. The HMD 172 is shown not to include lens-frames containing lens elements. The HMD 172 can include an on-board computing system 176 and a video camera 178, such as those described above in connection with FIGS. 1A and 1B.

The HMD 172 can include a single lens element 180, which can be coupled to one of the side-arms 173 or to the center frame support 174. The lens element 180 can include a display, such as, for example, the display described above in connection with FIGS. 1A and 1B. The lens element 180 can be configured to overlay computer-generated graphics upon the wearer's view of the physical world. For example, the single lens element 180 can be coupled to the inner side (the side exposed to a portion of a wearer's head when worn by the wearer) of the extending side-arm 173. The single lens element 180 can be positioned in front of or proximate to a wearer's eye when the HMD 172 is worn by a wearer. For example, the single lens element 180 can be positioned below the center frame support 174, as shown in FIG. 1D.

Figure 2:
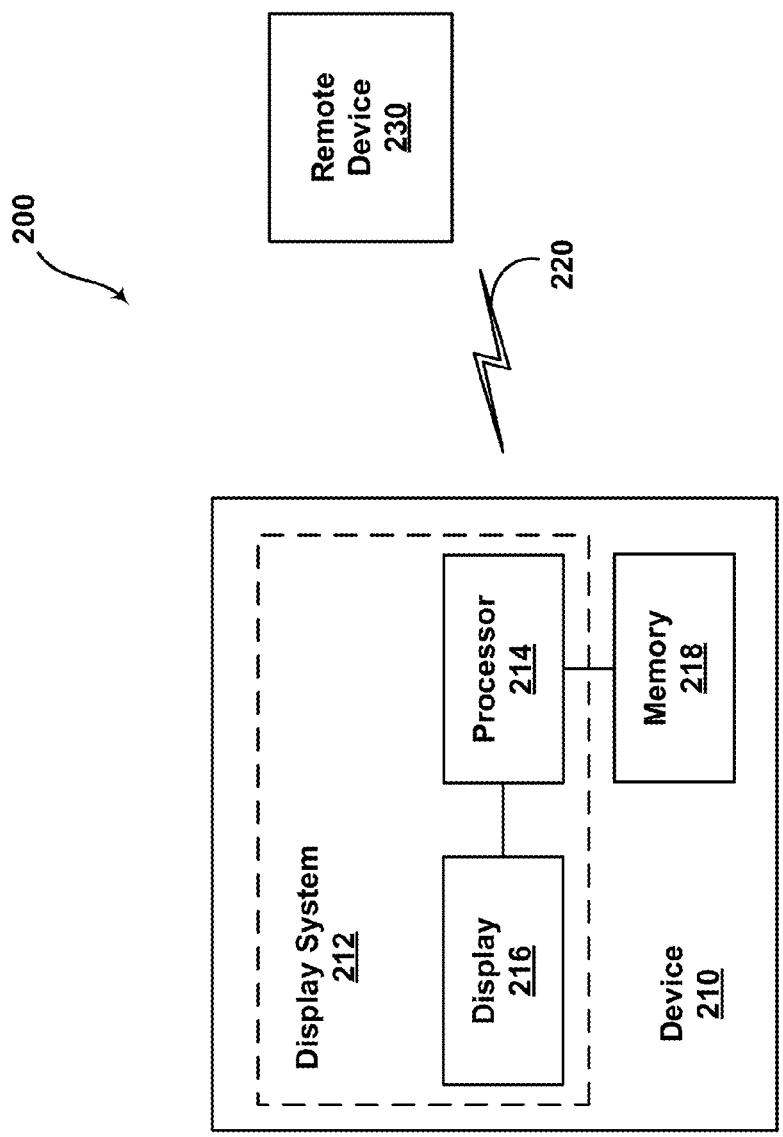
FIG. 2 illustrates a computing device, according to an embodiment.

FIG. 2 illustrates a schematic illustration of a computing device, according to an embodiment. In the system 200, a device 210 communicates using a communication link 220 (for example, a wired or wireless connection) to a remote device 230. The device 210 can be any type of device that can receive data and display information corresponding to or associated with the data. For example, the device 210 can be an HMD, such as, for example, the HMDs 102, 152, and 172 discussed above in connection with FIGS. 1A-1D.

The device 210 can include a display system 212. The display system 212 a processor 214 and a display 216. The display 210 can be, for example, an optical see-through display, an optical see-around display, or a video see-through display. The processor 214 can receive data from the remote device 230, and configure the data for display on the display 216. The processor 214 can be any type of processor, such as, for example, a micro-processor or a digital signal processor.

The device 210 can further include on-board data storage, such as a memory 218 coupled to the processor 214. The memory 218 can, for example, store software that can be accessed and executed by the processor 214.

The remote device 230 can be any type of computing device or transmitter. Examples include a laptop computer, a mobile telephone, and a tablet computing device. The remote device 230 and the device 210 can contain hardware to enable the communication link 220. Examples of such hardware include processors, transmitters, receivers, and antennas.

The communication link 220 is illustrated as a wireless connection; however, wired connections can also or instead be used. For example, the communication link 220 can be a wired serial bus, such as a universal serial bus or a parallel bus. A wired connection can be a proprietary connection as well. The communication link 220 can also be a wireless connection using, for example, Bluetooth® radio technology, communication protocols described in IEEE 802.11 (including any IEEE 802.11 revisions), cellular technology (such as GSM, CDMA, UMTS, EV-DO, WiMAX, or LTE), or Zigbee® technology, among other possibilities. The remote device 230 can be accessible by way of the Internet and can include a computing cluster associated with a particular web service, such as, for example, social-networking, photo sharing, or an address book.

III. Example of an Optical System

Figure 3A:
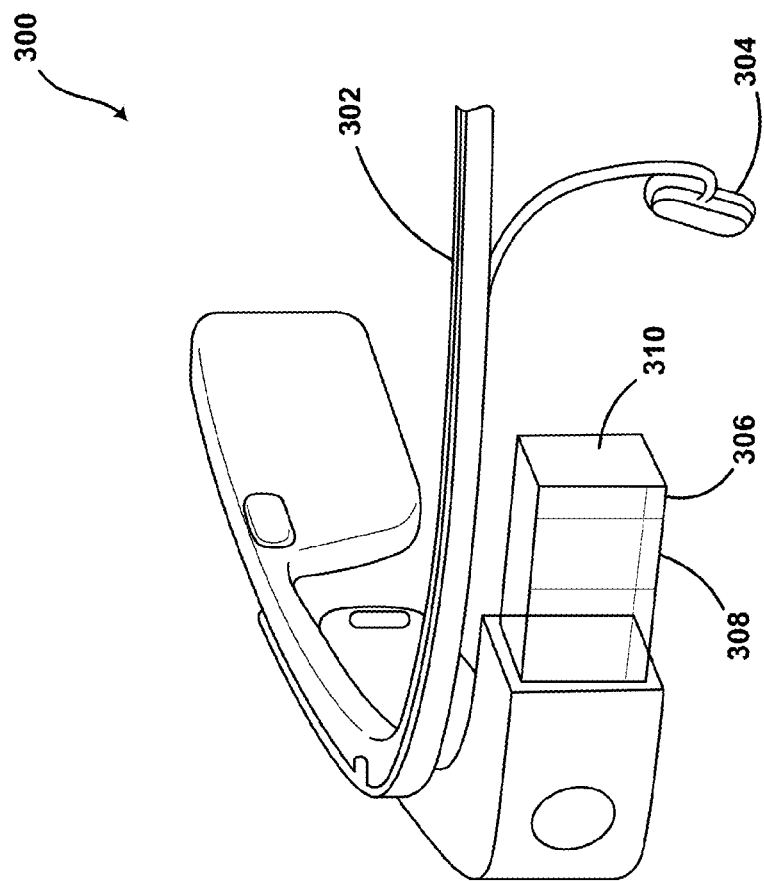
FIG. 3A illustrates a front view of an optical system, according to an embodiment.

FIG. 3A illustrates a front view of an optical system 300, according to an embodiment. The optical system 300 may include a frame 302, nose support(s) 304, and a light source, such as a display panel. The light source may be configured to provide a light pattern. The optical system 300 may further include an optical component 306, which may be formed from optical materials known in the art. Such optical materials may include, but are not limited to, optical glass, such as borosilicate glass, crown glass, flint glass, fused silica, Pyrex, Zerodur, and BK7, or optical plastics, such as Cyclo Olefin Polymer, acrylic, polystyrene, polycarbonate, Zeonex E-48R, and Zeonor. Other optical materials are possible in optical component 306, including materials with known useful transmissive, reflective, bi-refringent, polarizing, and/or other properties.

The optical component 306 may include a beam splitter 308 that may be configured to provide a view such that outside light and the virtual image are visible. For example, a wearer of the optical system 300 may be able to view the outside world and a virtual image using the beam splitter 308.

The optical component 306 may additionally include an image former configured to form a virtual image from the light pattern generated by the light source of the optical system 300. The image former may include a first end surface 310. The first end surface 310 may have a finite radius of curvature. That is, the first end surface 310 may be curved, at least slightly. In one embodiment, the first end surface 310 may be spherically curved with a fixed radius of curvature. In other embodiments, the first end surface 310 may be any general surface with optical power. For example, the first end surface 310 may be a Fresnel lens, a ridged mirror, or a zone plate. Other configurations of the first end surface 310 are possible.

The first end surface 310 may be coated with one or more optically-reflective materials in a multilayer stack. In such a way, the interior side of the first end surface 310 may act as a mirror. For example, the first end surface 310 may be configured as a flat mirror. Alternatively, the first end surface 310 may be configured as a concave or converging mirror. Yet further, the first end surface 310 may be configured as an off-axis parabolic mirror. The first end surface 310 may be configured as a Fresnel or a ridged mirror. Other types of mirrors are contemplated within the scope of this disclosure.

In one embodiment, the optical system 300 may be configured to direct at least a portion of the light pattern generated by the light source through the optical component 306 such that the portion of the light pattern is incident upon the interior side of the first end surface 310 of the optical component 306. Thus, a light pattern may be generated by the light source. The light pattern may pass, at least in large part, through the beam splitter 308. The light pattern may impinge upon the interior side of the first end surface 310. The first end surface 310, in conjunction with the multilayer stack described below, may act to reflect and focus the light pattern. Beam splitter 308 may cause the reflected light to be, in large part, directed towards a wearer's eye or eyes.

In such an embodiment, the combination of the multilayer stack and the interior side of the first end surface 310 may form a concave mirror with respect to the light pattern generated by the light source.

Figure 3B:
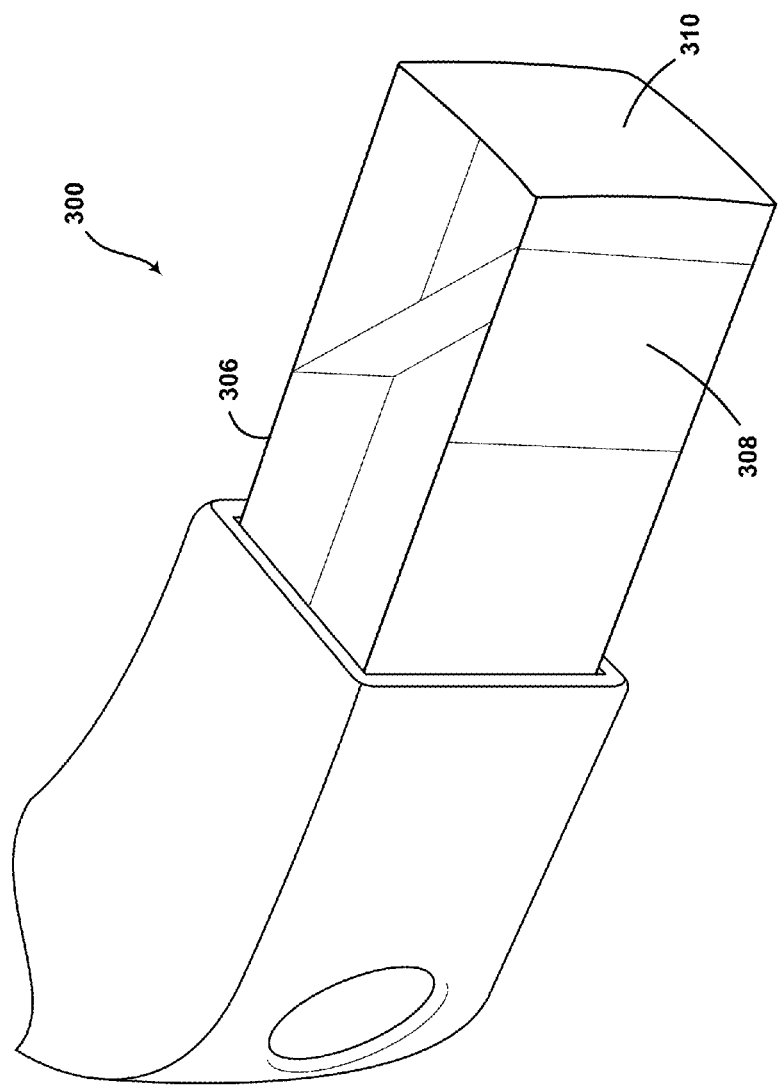
FIG. 3B illustrates a close-up oblique view of an optical system, according to an embodiment.

FIG. 3B provides a close-up oblique view of the optical system 300, according to an embodiment. Optical component 306 may include a beamsplitter 308 and the first end surface 310.

Figure 4:
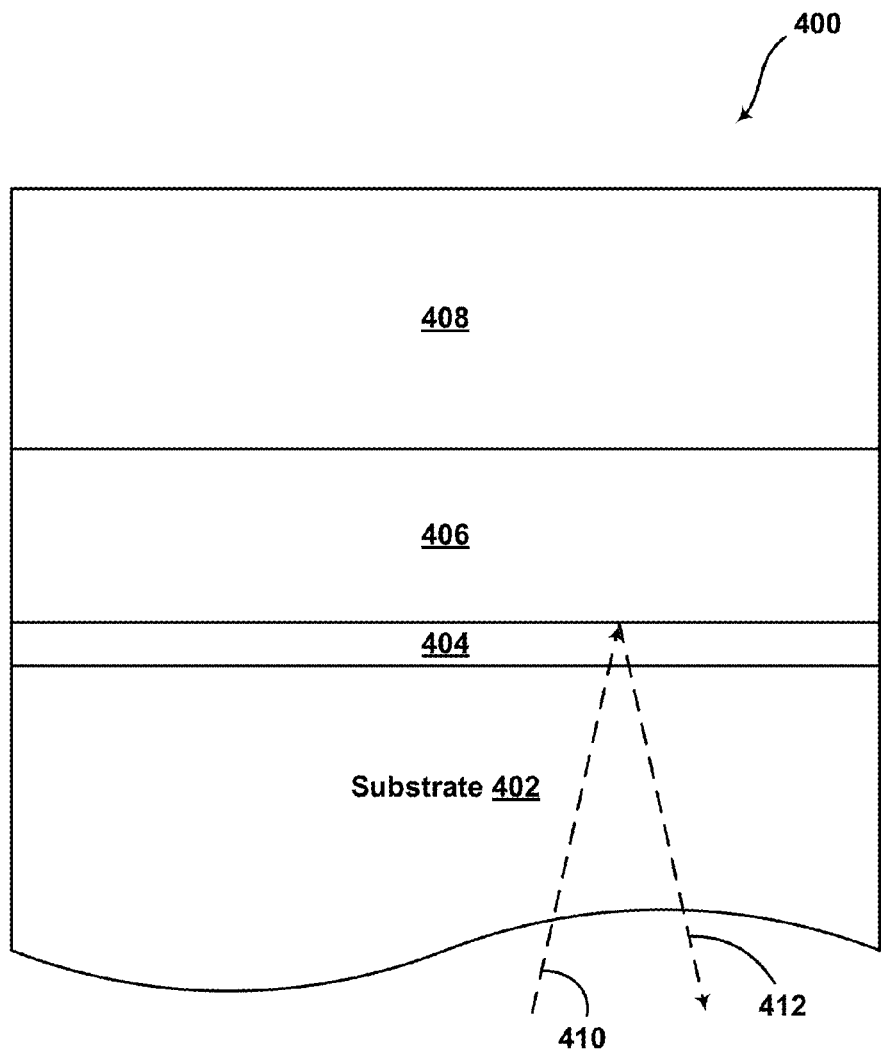
FIG. 4 illustrates an optical component, according to an embodiment.

FIG. 4 illustrates an optical component 400, according to an embodiment. The substrate 402 may be coated with a multilayer stack. In an embodiment, the substrate 402 may include Zeonex E-48R. The multilayer stack may be composed on a substrate 402, such as the first end surface 310. A first layer 404 may be composed on the substrate. A second layer 406 may be composed on the first layer 404. A third layer 408 may be composed on the second layer 406. The first layer 404 may include $Al_2O_3$ and may be directly or indirectly composed on the substrate 402 and/or the first end surface 310. The $Al_2O_3$ may have a layer thickness between 20 nm and 30 nm. The second layer 406 may include Al and the second layer 406 may be composed on the $Al_2O_3$ layer. The Al may have a layer thickness between 90 nm and 110 nm. The third layer 408 may include $SiO_2$ and the third layer 408 may be composed on the Al layer. The $SiO_2$ may have a layer thickness between 140 nm and 160 nm.

In an embodiment, the thickness between the substrate 402 and the second layer 406 may be less than 200 nm. That is, the first layer 404 may be maintained below 200 nm.

A combination of the first, second, and third layers may have an overall layer thickness between 250 nm and 300 nm. Other layer thicknesses within the multilayer stack are possible. In some embodiments, additional layers may be formed between the $Al_2O_3$ and Al layers. For example, the additional layers may act to increase reflectivity of the optical element with a possible performance trade-off due to optical aberrations.

As formed, the multilayer stack may act to reflect light, as stated above. For example, an incoming light ray 410 may be at least partially reflected off of the second layer 406. In such scenarios, reflected light ray 412 may be reflected back through the substrate 402.

Other materials are contemplated for use within the multilayer stack. Alternative or additional reflective materials may be added to or act as substitutes for the Al layer. For example, Au, Ag, Ti, Pt, Ni, Pd, or other materials individually or in combination may be used as a reflective layer. Further, alternative or additional adhesion layer materials may be added to or act as substitutes for the $Al_2O_3$ layer. Yet further, alternative or additional protective layer materials may be added to or act as substitutes for the $SiO_2$ layer. For example, materials known in the art to provide good structural and/or hardness properties, such as SiN, SiC, or other carbon-based materials, may be used.

In some embodiments, a variation in the layer thickness of one or more layers in the multilayer stack may be controlled within tight tolerance. For example, the combination of the first, second, and third layers of the multilayer stack may include an edge slope. The edge slope may represent an increase or decrease in the thickness of one or more of the layers at a point at or near the edge of the first end surface 310. In some embodiments, the edge slope from may be less than 100 nanometers per 100 microns measured from an edge of the first end surface 310. By closely controlling the edge slope of the multilayer stack, optical distortions, such as streaking, may be eliminated or reduced.

IV. Example of a Method of Manufacturing an Optical Component/System

Figure 5:
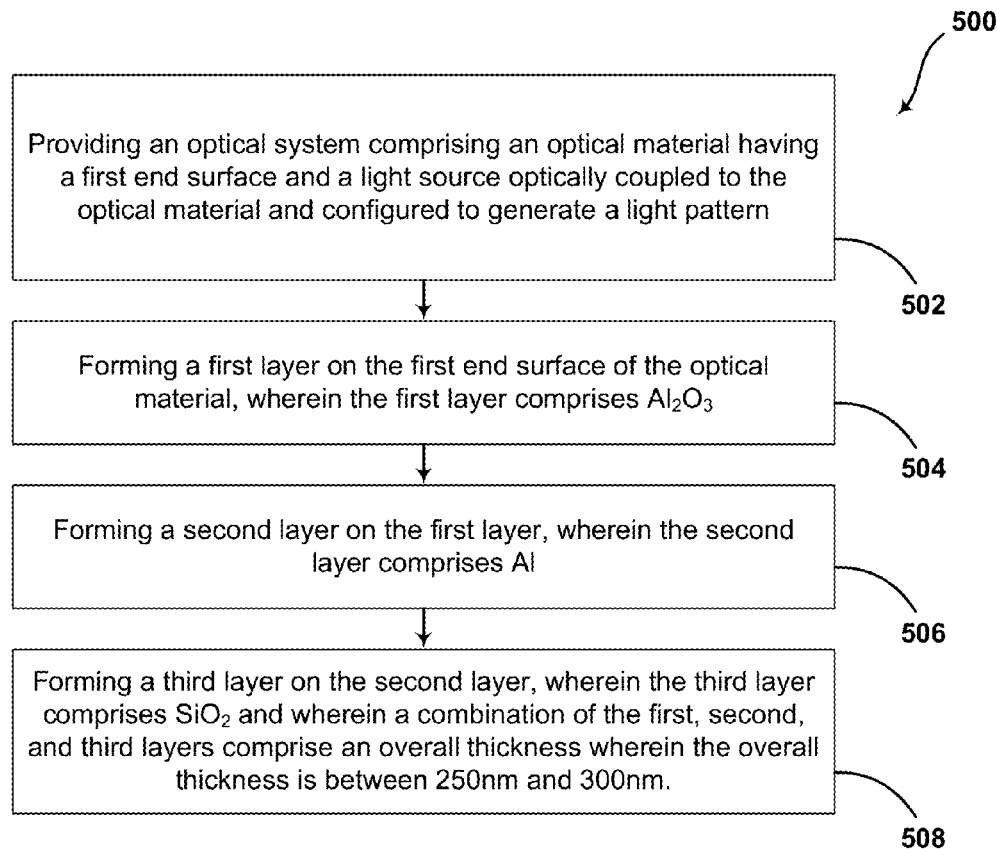
FIG. 5 illustrates a method, according to an embodiment.

FIG. 5 illustrates a method 500, according to an embodiment. The method may include various blocks or steps. The blocks or steps may be carried out individually or in combination. The blocks or steps may be carried out in any order and/or in series or in parallel. Further, blocks or steps may be omitted or added to method 500.

Block 502 includes providing an optical system. The optical system may include an optical material that may include a first end surface. The optical system may further include a light source such as a display panel. The light source may be optically coupled to the optical material. The light source may be configured to generate a light pattern.

As described above, the optical system may include one or more optical materials known in the art, such as optical glass or optical plastic, e.g. Cyclo Olefin Polymer. The first end surface may include Zeonex E-48R.

Block 504 includes forming a first layer on the first end surface of the optical material. The first layer includes $Al_2O_3$. In one embodiment, the $Al_2O_3$ layer may be formed directly on the optical material and may provide an "adhesion layer" upon which a reflective material may be deposited. Other materials known to provide good adhesion or intermediary properties between reflective materials and optical materials are contemplated within the scope of this disclosure. As described above, the first layer may include a plurality of materials and a thickness of the first layer may be below 200 nm.

Block 506 includes forming a second layer on the first layer. The second layer include Al, or aluminum. In one embodiment, the Al layer may act primarily as an optically reflective layer, particularly within the visible light spectrum. Other materials that provide good reflectance in the visible spectrum are contemplated within the scope of this disclosure.

Block 508 includes forming a third layer on the second layer. The third layer includes $SiO_2$. In one embodiment, the $SiO_2$ layer may act primarily as a protective layer. Other materials that provide good protection to the underlying reflective layer and optical component/material are contemplated within the scope of this disclosure. For example, the third layer may additionally or alternatively include SiN, SiC, or other materials with a high degree of hardness and/or scratch resistance.

The combination of the first, second, and third layers includes an overall thickness. The overall thickness may be between 250 nm and 300 nm.

In some embodiments, the optical system may be configured to operate as a head-mountable device. In such scenarios, the optical system may include a beam splitter optically coupled to the optical material. The beam splitter may be similar to that illustrated and described with reference to FIGS. 3A and 3B. The beam splitter may be configured such that outside light is visible through it.

The first end surface of the optical material may include a finite radius of curvature. In other words, the first end surface of the optical material may be curved. For example, the first end surface of the optical material may include a spherical extrusion. As such, in conjunction with the aforementioned reflective multilayer stack, the first end surface may serve as a converging/concave mirror with respect to light impinging on the reflective material from the interior of the optical component/material.

In other embodiments, the first end surface may be a surface with optical power. For example, the first end surface of the optical material may include a Fresnel lens, a ridged mirror, or a zone plate. Other configurations of the first end surface are possible.

Some or all of the layers in the multilayer stack may be deposited using physical vapor deposition. Other deposition techniques are contemplated, including atomic layer deposition, chemical vapor deposition (CVD), ICP-CVD, and MOCVD.

As stated above, a variation in the layer thickness of one or more layers in the multilayer stack may be controlled within tight tolerance. For example, the combination of the first, second, and third layers of the multilayer stack may include an edge slope. The edge slope may represent an increase or decrease in the thickness of one or more of the layers at a point at or near the edge of the first end surface. In some embodiments of the method, deposition rate, pressure, temperature, and other deposition parameters may be controlled so as to maintain the edge slope so as to be below 100 nanometers per 100 microns as measured from an edge of the first end surface.

V. CONCLUSION

The particular arrangements shown in the Figures should not be viewed as limiting. It should be understood that other embodiments may include more or less of each element shown in a given Figure. Further, some of the illustrated elements may be combined or omitted. Yet further, an illustrative embodiment may include elements that are not illustrated in the Figures.

While various examples and embodiments have been disclosed, other examples and embodiments will be apparent to those skilled in the art. The various disclosed examples and embodiments are for purposes of illustration and are not intended to be limiting, with the true scope and spirit being indicated by the following claims.

What is claimed is:

1. An optical system, comprising:
    an image former configured to form a virtual image from a light pattern, wherein the image former comprises:
        a first layer composed on a first surface of an optical material, wherein the first surface comprises a finite radius of curvature;
        a second layer composed on the first layer; and
        a third layer composed on the second layer, wherein the first layer comprises $Al_2O_3$, the second layer comprises Al, and the third layer comprises $SiO_2$.

2. The optical system of claim 1 wherein the optical system is configured as a head-mountable device and wherein the optical system further comprises: a beam splitter through which outside light and the virtual image are visible, and a light source configured to generate the light pattern.

3. The optical system of claim 1 wherein the optical material is Zeonex E-48R.

4. The optical system of claim 1 wherein the first layer further comprises a first layer thickness between 20 nm and 30 nm of $Al_2O_3$.

5. The optical system of claim 1 wherein the second layer further comprises a second layer thickness between 90 nm and 110 nm of Al.

6. The optical system of claim 1 wherein the third layer further comprises a third layer thickness between 140 nm and 160 nm of $SiO_2$.

7. The optical system of claim 1 wherein a combination of the first, second, and third layers comprise an overall layer thickness between 250 nm and 300 nm.

8. The optical system of claim 2 wherein a combination of the first, second, and third layers comprise a concave mirror with respect to the light pattern generated by the light source.

9. The optical system of claim 8 wherein the combination of the first, second, and third layers further comprises an edge slope wherein the edge slope is less than 100 nanometers per 100 microns as measured from an edge of the first surface.

10. A method of manufacturing an optical system, comprising:
    providing an optical system comprising:
        an optical material having a first surface, wherein the first surface comprises a finite radius of curvature; and
        a light source optically coupled to the optical material and configured to generate a light pattern;
    forming a first layer on the first surface of the optical material, wherein the first layer comprises $Al_2O_3$;
    forming a second layer on the first layer, wherein the second layer comprises Al; and forming a third layer on the second layer, wherein the third layer comprises $SiO_2$, wherein a combination of the first, second, and third layers comprise an overall thickness wherein the overall thickness is between 250 nm and 300 nm.

11. The method of manufacturing an optical system of claim 10 wherein the optical system is configured to operate as a head-mountable device and further comprising a beam splitter optically coupled to the optical material and through which outside light is visible.

12. The method of manufacturing an optical system of claim 10 wherein the optical material comprises Zeonex E-48R.

13. The method of manufacturing an optical system of claim 10 wherein forming the first layer further comprises depositing the first layer with a first layer thickness between 20 nm and 30 nm of $Al_2O_3$.

14. The method of manufacturing an optical system of claim 10 wherein forming the second layer further comprises depositing the second layer with a second layer thickness between 90 nm and 110 nm of Al.

15. The method of manufacturing an optical system of claim 10 wherein forming the third layer further comprises depositing the third layer with a third layer thickness between 140 nm and 160 nm of $SiO_2$.

16. The method of manufacturing an optical system of claim 10 wherein forming the first, second, and third layers comprises depositing the respective layers using a physical vapor deposition technique.

17. The method of manufacturing an optical system of claim 10 wherein forming the first, second, and third layers comprises depositing the respective layers using an atomic layer deposition technique.

18. The method of manufacturing an optical system of claim 10 wherein a combination of the first, second, and third layers further comprises an edge slope wherein the edge slope is less than 100 nanometers per 100 microns as measured from an edge of the first surface.

19. The optical system of claim 1 wherein the first surface is spherically curved.

20. The method of manufacturing an optical system of claim 10 wherein the first surface is spherically curved.

* * * * *